United States Patent [19]

Chrzan

[11] Patent Number: 5,065,124

[45] Date of Patent: Nov. 12, 1991

[54] DC-40 GHZ MODULE INTERFACE

[75] Inventor: Lee J. Chrzan, Half Moon Bay, Calif.

[73] Assignee: Watkins-Johnson Company, Palo Alto, Calif.

[21] Appl. No.: 578,668

[22] Filed: Sep. 4, 1990

[51] Int. Cl.$^5$ .............................................. H01P 5/00
[52] U.S. Cl. .................................... 333/246; 333/260; 361/393
[58] Field of Search ................ 333/33, 246, 247, 260; 361/393, 412, 413; 330/66, 307

[56] References Cited

U.S. PATENT DOCUMENTS

| | | | |
|---|---|---|---|
| 4,186,358 | 1/1980 | Czech et al. | 333/33 |
| 4,208,642 | 6/1980 | Saunders | 333/246 |
| 4,611,186 | 9/1986 | Ziegner | 333/33 X |
| 4,870,375 | 9/1989 | Krueger, Jr. et al. | 333/33 |

Primary Examiner—Paul Gensler
Attorney, Agent, or Firm—Law Offices of Thomas E. Schatzel

[57] ABSTRACT

A module having a microwave circuit carrier with ribbon conductors for both the fifty ohm transmission line and ground connections. The carrier has a platform raised from the floor of the carrier at the outside interfacing edges. A ribbon conductor is welded between the raised lips on abutting carriers to form a uniform ground plane accessible to top assembly. A second ribbon is welded between RF conductors on substrates in the respective carriers and spans over the interface and the ribbon ground plane. By proper choice of ribbon conductor widths and the spanning height above the ground plane, a fifty ohm impedance can be maintained.

14 Claims, 4 Drawing Sheets

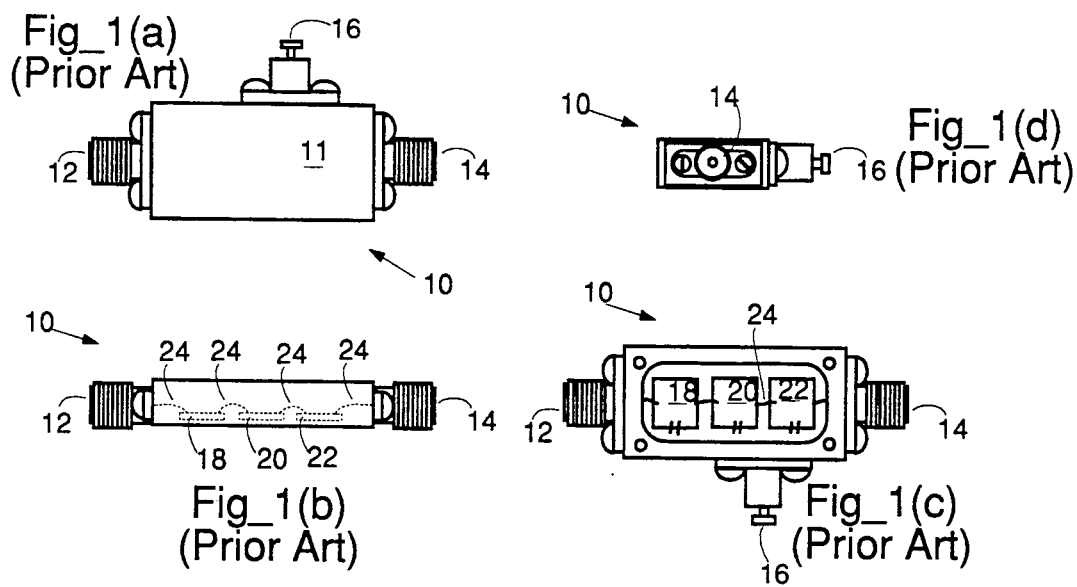
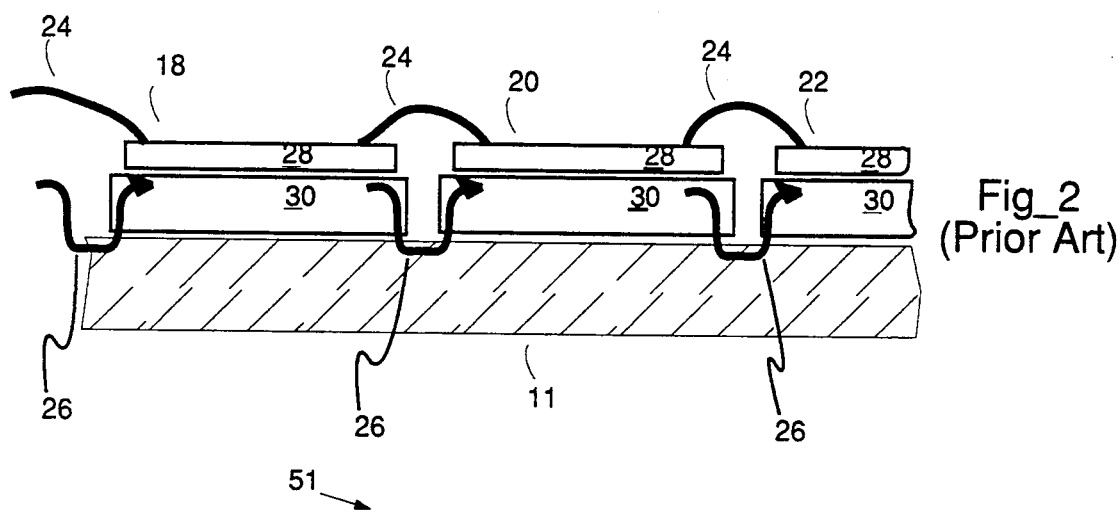
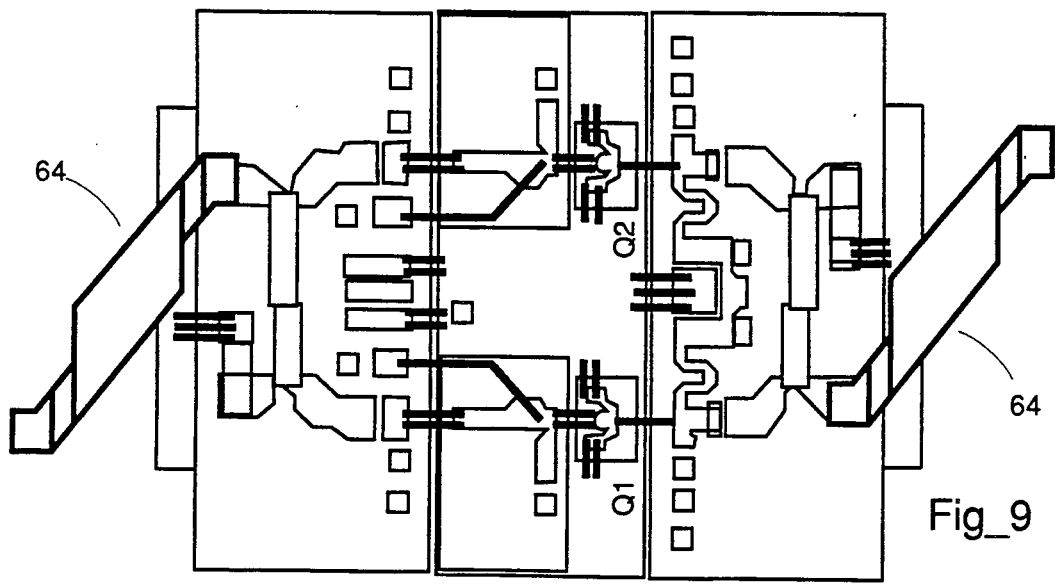

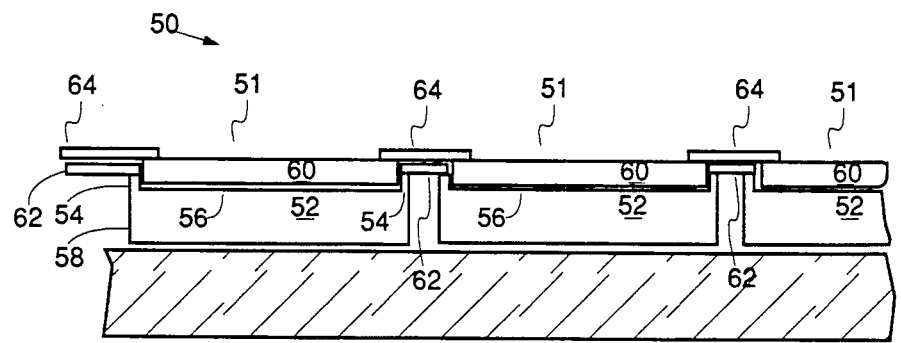
Fig_3(a)
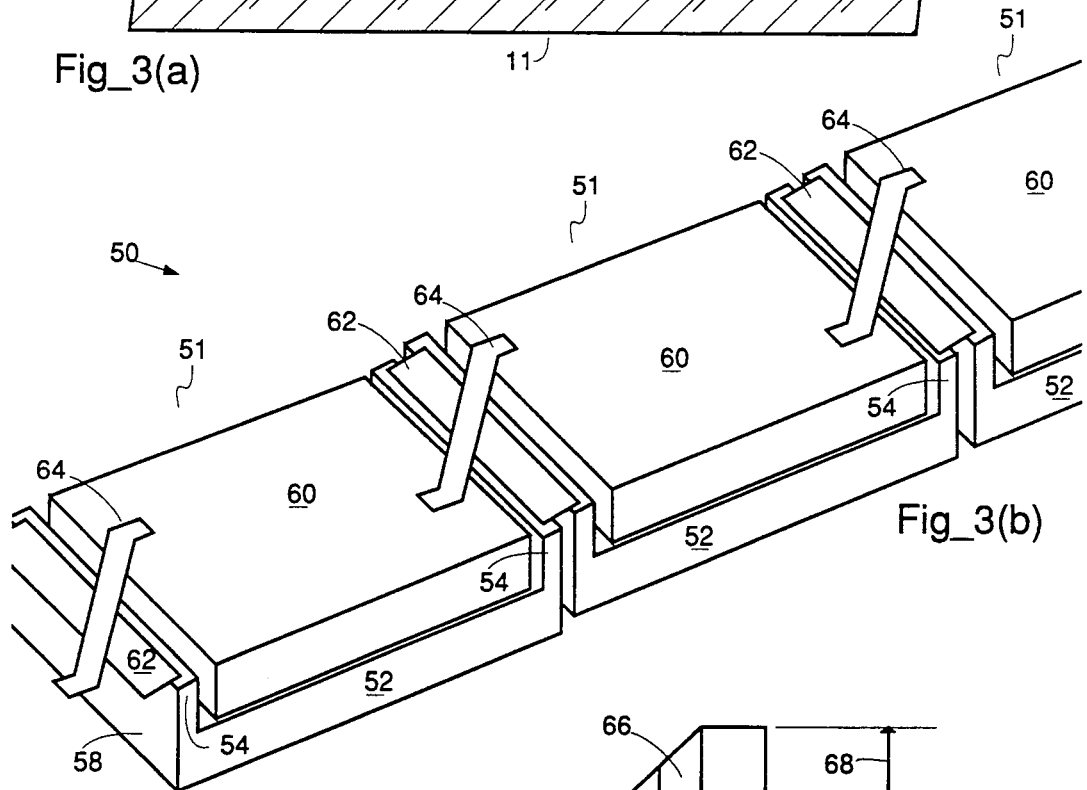
Fig_3(b)
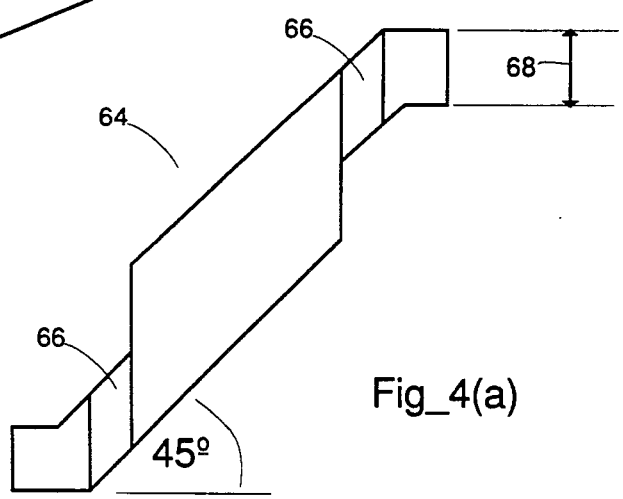
Fig_4(a)
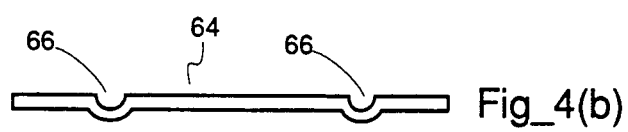
Fig_4(b)

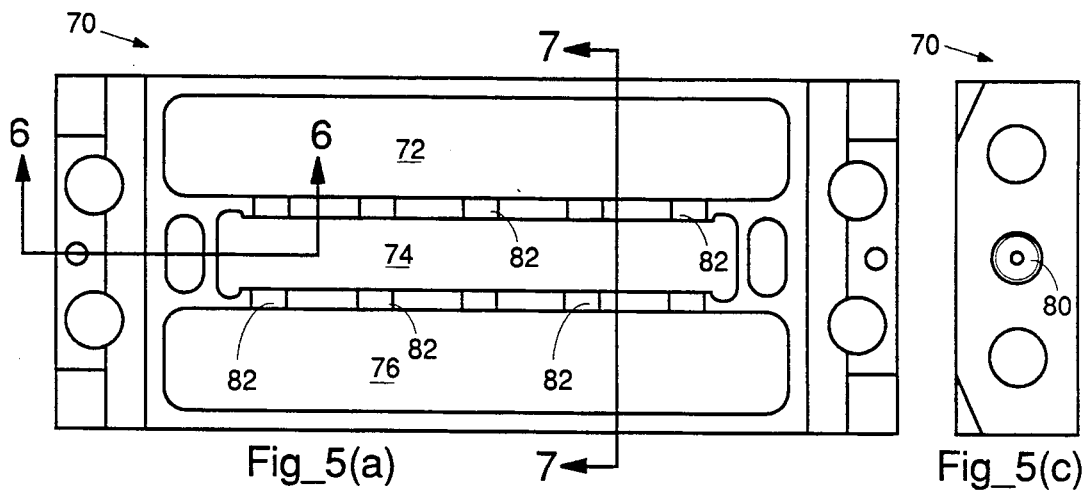
Fig_5(a)  Fig_5(c)
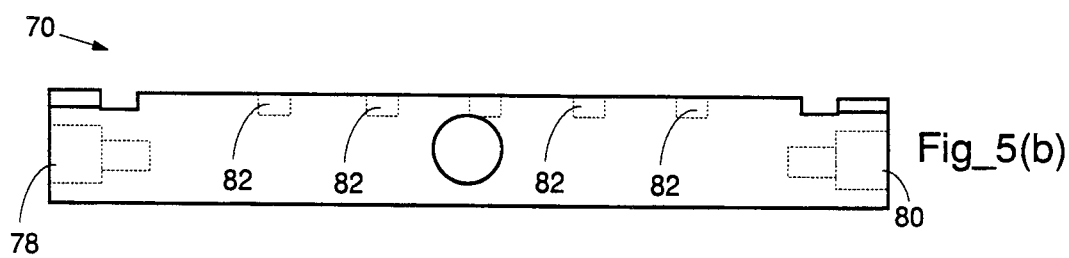
Fig_5(b)
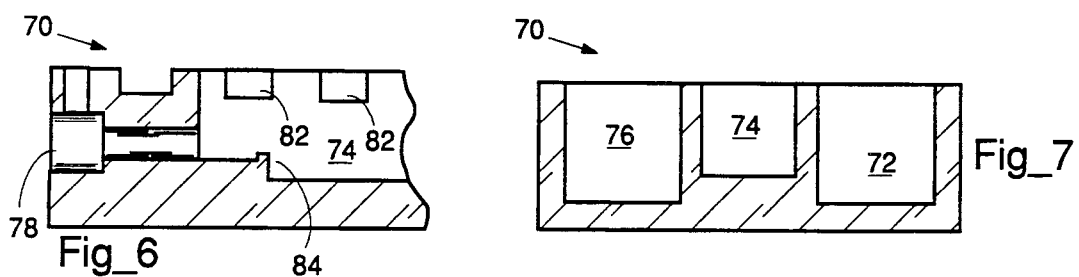
Fig_6  Fig_7
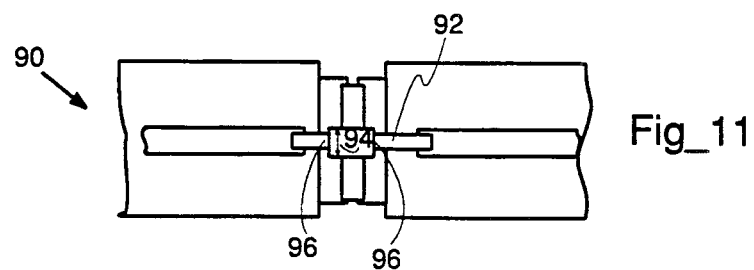
Fig_11

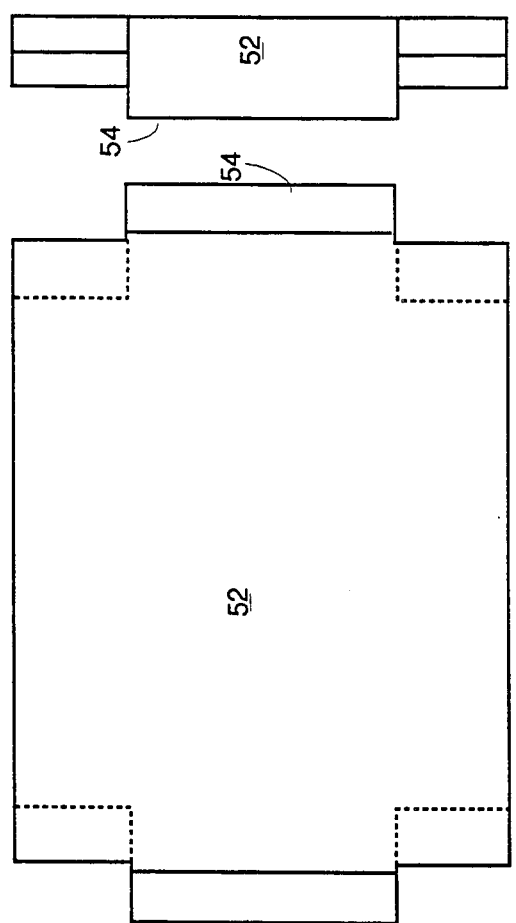
Fig_10(a)
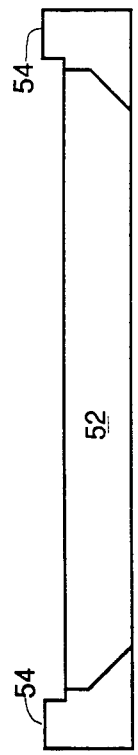
Fig_10(b)
Fig_10(c)
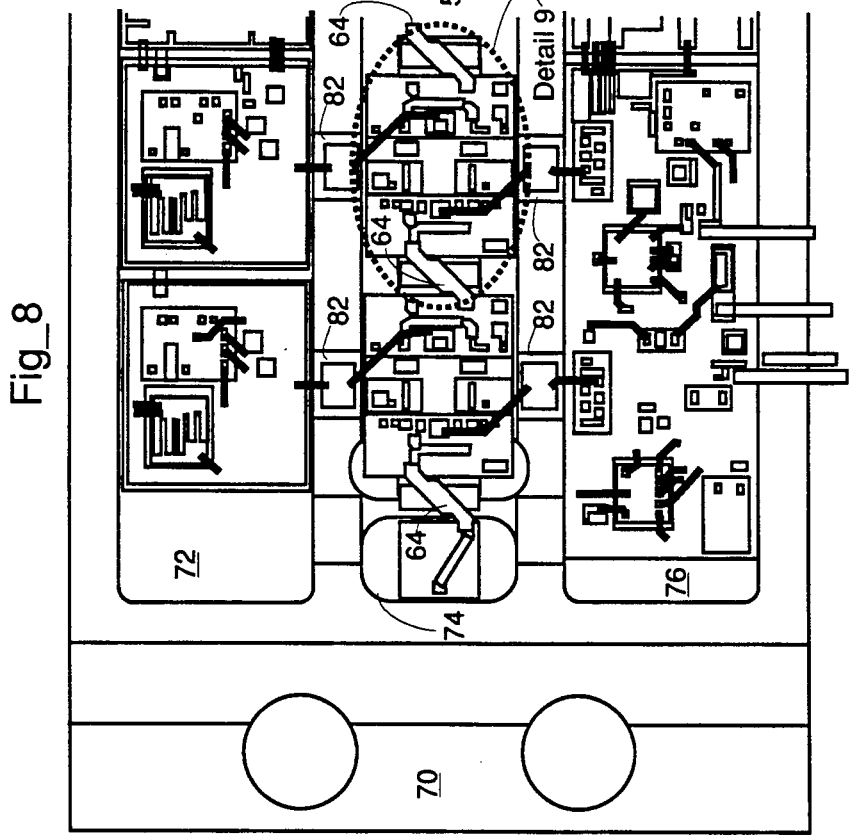
Fig_8

DC-40 GHZ MODULE INTERFACE

BACKGROUND OF THE INVENTION

1. Field of the Invention

The invention relates generally to microwave amplifier assemblies and more specifically to methods and apparatus for modular assembly interconnections that have a low Voltage Standing Wave Ratio (VSWR) at eighteen GHz and above.

2. Description of the Prior Art

Gallium-arsenide (GaAs) field-effect transistor (FET) microwave amplifiers which cover the 0.5 GHz to twenty GHz band, and with output powers up to to two watts, are available from several manufacturers including Watkins-Johnson, Celeritek, and Avantek. Both balanced and feedback techniques are used with thin-film MIC and MMIC construction to achieve broadband performance. Typical amplifier designs are qualified and operated in the environments of MIL-STD-883 (space), MIL-E-5400 (airborne), MIL-E-16400 (shipboard), and MIL-E-4158 (ground). Some units are even tested to Hardness Assurance Lot Acceptance Test (HALAT) for space and strategic radiation dose tolerance levels.

Watkins-Johnson (Palo Alto, CA) manufactures ultra wideband small signal and power amplifiers for the 2-18 GHz band using a "matrix amplifier," which is reported in the March 1987 IEEE MTT Transactions. See, K. B. Niclas, R. R. Pereia, A. J. Graven, and A. P. Chang, "Design and Performance of a New Multi-octave High-gain Amplifier," 1987 IEEE MTT-S International Microwave Symposium Digest, pp.829-832. MMIC's and replaceable connectors are typically used in such amplifiers.

Celeritek (San Jose, CA) sells a line of "balanced amplifier" designs, models CMA and CMT, manufactured with MIC technology. The balanced design is promoted by Celeritek to improve interstage matching so several gain stages can be cascaded to achieve high gain while maintaining flat gain response. Three versions of amplifiers are available for operation from 18-26 GHz, 26-40 GHz, and over the full 18-40 GHz bandwidth. Units are assembled with interchangeable gain modules, allowing users to choose the amount of gain needed for particular applications. Two types of Celeritek FET's are used in the amplifiers, 150-$\mu$m devices that yield 5-dB gain, and 300-$\mu$m devices that deliver about 4-dB gain per stage. Cases for the CMT and CMA amplifiers use welded seals, glass-to-metal feedthroughs, and "K" type field replaceable connectors, with 2.4 mm coaxial connectors and waveguide interface connectors available as options.

Avantek (San Jose, CA) produces a line of wideband millimeter amplifiers known as the AMT/AWT series. This series performs over octave (AMT) and multi-octave (AWT) bands. The Avantek IK series packaging is a hermetically-sealed machined aluminum housing having optional waveguide and field-replaceable three millimeter coaxial connectors. The case length varies depending on the amount of gain and number of functions included.

In the prior art, it has been difficult to design amplifiers and subsystems using "modular construction" at frequencies above eighteen GHz, due to RF matching problems between modules. ("Modular construction" means building a unit meeting complex specifications from a supply of independently assembled, tuned, and tested modules designed to perform simple generic functions.) Modules consisting of substrates and chip components mounted on a metal carrier have problems maintaining a fifty ohm impedance in the region between modules. (The metal carrier is the mechanical and thermal base, as well as the RF ground plane.)

FIGS. 1(a)-(d) illustrate a typical coax case, referred to by the general reference numeral 10. The case 10 has a housing 11, an input coax connector 12, an output coax connector 14, and a DC power input 16. In FIGS. 1(b) and 1(c), a series of three amplifier modules, 18, 20, and 22, are inside housing 11. Module 18 is wire bonded to coax connector 12 and module 20 with wire bonds 24. Modules 20 and 22, and coax connector 14 are similarly interconnected with wire bonds 24. Modules 18, 20, and 22 may comprise dielectric substrates on metal carriers or may be just the substrate itself. In either event, the modules 18, 20, and 22 are bonded to the floor inside housing 11.

In FIG. 2, the wire bond 24 connections between modules 18, 20, and 22 are shown in greater detail. In the prior art, wire bonds 24 are ordinary round gage bonding wire, although ribbon or mesh are also used. The wire bonds 24 simply span over the space between the modules 18, 20, and 22. Ground paths are represented by arrows 26. Each of modules 18, 20, and 22 are comprised of a substrate 28 and a carrier 30. Above eighteen GHz, the prior art construction method shown in FIG. 2 will no longer operate satisfactorily. The wire bonds 24 have a prohibitively high impedance due to the air between modules acting as a dielectric, the small wire bond 24 size, the distance to ground in housing 11, and the distance between substrates 28. Multiple ribbons or wire bonds 24 reduce the impedance somewhat, but it remains well above fifty ohms. The ground paths 26 are electrically very long and cause problems, including that of having to optimize the thickness of carriers 30 to keep ground paths short. Thinner is better for the ground path, but too thin a carrier 30 can lead to substrate 28 cracking because carrier 30 is not a rigid enough support. In some cases, the carriers 30 have been eliminated, and the substrates 28 attached directly to housing 11. This shortens the ground paths 26 somewhat, but the impedance of the wire bonds 24 remains high. One problem with attaching substrates 28 directly to housing 11 with various solders is if any one module 18, 20, or 22 is defective, removal and replacement of that module is not practical and the entire assembly of case 10 is also defective and is wasted. If conductive epoxy attachment is used, modules may be removed, but the conductivity of the epoxy joint at the substrate 28 to housing 11 interface becomes critical and is difficult to manufacture reliably.

SUMMARY OF THE PRESENT INVENTION

It is therefore an object of the present invention to provide modules that are capable of modular construction at frequencies above eighteen GHz and that do not exhibit RF matching problems between the modules.

It is a further object of the present invention to build modules comprising substrates and chip components mounted on a metal carrier which maintain a fifty ohm impedance in the region between modules.

It is a further object of the present invention to be able to independently assemble, tune, and test modules designed to perform simple generic functions.

Briefly, a preferred embodiment of the present invention comprises an amplifier module having a metal, microwave circuit carrier with ribbon conductors for both fifty ohm transmission line and ground connections. The carrier has a lip raised from the floor of the carrier at the outside interfacing edges. A ribbon conductor is welded between the raised lips on abutting carriers to form a uniform ground plane accessible to top assembly. A second ribbon conductor is welded between RF conductors on substrates on the respective carriers, and spans over the interface and the ribbon conductor ground plane. By proper choice of (1) the second ribbon conductor's width, and (2) the spanning height above the ground plane, a fifty ohm impedance can be maintained.

An advantage of the present invention is that a fifty ohm impedance can be maintained in joining modules within a case or housing, resulting in low VSWR's.

Another advantage of the present invention is that VSWR performance is not degraded with larger module spacings and longer ribbons, making performance more tolerant of module spacing variations in assembly and allowing access to module carriers for removal.

Another advantage of the present invention is that top assembly is practical, and thus manufacturing is simplified.

Another advantage of the present invention is that standard thin-film design and manufacturing techniques can be used.

Another advantage of the present invention is that module carriers having circuit substrates can be thicker and optimized for purposes other than shortening the ground return path.

Another advantage of the present invention is that the attachment of the carrier to the housing is no longer critical at microwave frequencies, since ground currents are conducted through the ribbon between carriers.

Another advantage of the present invention is that ground access is at the top edge of a module where it normally wasn't available, and this simplifies and improves input and output coaxial and other connections.

These and other objects and advantages of the present invention will no doubt become obvious to those of ordinary skill in the art after having read the following detailed description of the preferred embodiments which are illustrated in the various drawing figures.

IN THE DRAWINGS

FIG. 1 is a prior art GaAs FET amplifier microwave assembly case having (a) a bottom view, (b) a side view, (c) a top view with a cover to the case removed revealing modules inside, and (d) an end view;

FIG. 2 is a side view detail of the modules and wire bonds in FIG. 1(b);

FIG. 3 is (a) a side view of a group of three modules and (b) a perspective view of the three modules, all built according to the present invention;

FIG. 4 is (a) a top view, and (b) a side view of the ribbon connector 64 of FIGS. 3(a) and 3(b);

FIG. 5 is (a) a top view, (b) a side view, and (c) an end view of a preferred embodiment of a housing made in accordance with the present invention;

FIG. 6 is a cross-sectional view of the housing in FIG. 5 taken along the lines 6—6;

FIG. 7 is a cross-sectional view of the housing in FIG. 5 taken along the lines 7—7;

FIG. 8 is a top assembly drawing of one third of the housing of FIG. 5, and shows microwave modules installed in the center cavity with support circuits in the outer cavities;

FIG. 9 is a detail view of the module circled in FIG. 8 and labeled "Detail 9";

FIG. 10 is (a) a top view, (b) a side view, and (c) an end view of a carrier comprising the present invention; and FIG. 11 is a top view of a preferred embodiment of the present invention for modules with in-line input and output connections.

DETAILED DESCRIPTION OF THE PREFERRED EMBODIMENTS

A preferred embodiment of the present invention comprises a number of modules having a carrier with ribbon conductors for both the fifty ohm transmission line and inter-module ground connections. In FIGS. 3(a) and 3(b), an amplifier, referred to by the general reference numeral 50, has a trio of modules 51, each with a carrier 52 having a pair of lips 54 raised from a floor 56 on top of carrier 52. Carrier 52 is mounted inside a housing, e.g., housing 11. The lips 54 are located at a pair of outside interfacing edges 58. Raising the lips 54 above the floor 56 helps control the flow of brazing material and gives greater access to ground from above modules 51. A substrate 60, made of any suitable dielectric material, such as alumina, plastic, beryllia, ceramic, etc., is mounted to carrier 52. A ribbon conductor 62 is gap welded or conductively attached between the raised lips 54 on adjacent and abutting modules in the group of modules 51 to form a uniform ground plane in the spaces between. A second ribbon conductor 64 is welded to RF conductors on substrate 60. Ribbon conductor 64 spans over the interface of edges 58 at a critical distance over ribbon conductor 62 forming a microstrip transmission line with an air dielectric. The theory and equations governing this transmission medium are well known. By proper choice of ribbon conductor 64 widths and the spanning height above ribbon conductor 62, a fifty ohm impedance is maintained. A 0.020 inch wide ribbon with a 0.004 inch height gives approximately fifty ohms impedance. Lip 54 is typically raised 0.005 inches above the floor 56 for 0.010 inch thick substrates 60. Carrier 52 is typically 0.030 inches thick (including lip 54), 0.195 inches long, and 0.135 inches wide. Carrier 52 is typically made of an iron-nickel-cobalt alloy whose chemical composition is controlled within narrow limits to assure a precise thermal expansion match to alumina or fused silica substrates, e.g. Carpenter Kovar ®, referred to below simply as "Kovar." Ribbon conductor 62 is whatever length of 0.020 inch wide gold ribbon is necessary to bridge between carriers 52, etc. Ribbon conductor 64 is gold, 0.001 inches thick by 0.020 inches wide, and whatever length is needed to span between substrates 60, etc. Ribbon conductor 64 crosses the distance between modules 51 at approximately a 45° angle to interconnect balanced amplifiers, which have their inputs and outputs located diagonally across. Any interconnect angle including 0° (in-line) may be accommodated by modifying the ribbon angle, since the impedance is not affected.

Referring now to FIGS. 4(a) and 4(b), ribbon conductor 64 has a pair of bends 66 that help to relieve stresses caused by thermal expansion and contraction and also to aid in assembly alignment. A width dimension 68 is critical to achieving a fifty ohm impedance of ribbon conductor 64 over ribbon conductor 62 between modules 51.

An exemplary embodiment of the present invention is shown in FIGS. 5(a), 5(b), and 5(c). A housing, referred to by the general reference numeral 70, has three cavities 72, 74, and 76. A coaxial input feedthrough 78 and an output feedthrough 80 are soldered at opposite ends of housing 70. Standard microwave connectors are then used to mate with the feedthroughs. Cavity 74 is designed to contain a series of modules that operate in the 18-40 GHz band and are supported by lower frequency power supply and control modules to each side in cavities 72 and 76. Cavity 74 must be narrow enough so as not to act as a waveguide for the operating frequencies or else microwave absorptive material must be included in the cavity. This means that modules placed within cavity 74 will have dimensions on the order of 0.200 inches by 0.140 inches, or smaller. A plurality of shallow slots 82 allow small ceramic dielectric capacitors to be attached within them, and are used to bond lower frequency conductors between cavity 74 and cavities 72 and 76. FIG. 6 reveals a lip 84 in housing 70 that is similar in function and use to lip 54 of module 51. A number of modules 51 are queued off of lip 84 within cavity 74 and arranged end to end such that ribbon conductors 62 may be welded between adjoining lips 84 & 54, 54 & 54, and 54 & 84.

In FIG. 8 the housing 70 has 18-40 GHz modules 51 arranged end-to-end in cavity 74. Support circuits are to each side in cavities 72 and 76. Ribbon conductors 64 interconnect the modules 51. FIG. 9 is a close-up view of a GaAs FET amplifier module 51 (details of which are omitted for clarity) and ribbon conductors 64. Ribbon conductor 64 is attached by welding at an angle to module 51. In FIG. 10, carrier 52 has two lips 54. Carrier 52 is typically made of Kovar, molybdenum, or other metals. A substrate, e.g., substrate 60, is bonded to carrier 52. Gold plating carrier 52 facilitates soldering, welding, and bonding operations necessary in the assembly of module 51.

An alternate embodiment of the present invention is shown in FIG. 11. This embodiment is preferred for modules with in-line inputs and outputs. A connection system, referred to by the general reference numeral 90, has a ribbon 92, which has a width 94 that is approximately the same as width 68. A pair of stress relief bends 96 are included in ribbon 92.

While the performance and manufacturability of the 18-40 GHz amplifier described above are greatly enhanced by the present invention, many other microwave products would also benefit in similar fashion. The present invention may be applied, in general, to any active or passive microwave module with one or more microstrip transmission line inputs or outputs. This includes, but is not limited to, amplifiers, attenuators, limiters, filters, switches, mixers, power dividers, detectors, oscillators, multipliers, and cascades, or combinations of two or more of these. These modules may incorporate one or more monolithic integrated circuits. Microwave sub-systems, which are cascades or combinations of these modules, can use the present invention to improve VSWR performance between modules at frequencies where the prior art techniques had been marginal and will extend modular construction capabilities to at least forty GHz.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A microwave module, comprising:
   a carrier having at least one lip upwardly raised from the floor of said carrier at an interfacing edge, said raised lip operable to attachably receive a first RF conductor, said first RF conductor being a ground conductor; and
   a substrate attached to the carrier having an RF transmission line operable to attachably receive a second RF conductor such that said second RF conductor will have a characteristic impedance of under 100 ohms by virtue of the disposition and size of said second RF conductor.

2. The module of claim 1, wherein said first RF conductor is a first ribbon conductor.

3. The module of claim 2, wherein:
   the carrier is conductive, whereby electrically conductive attachment of said first RF conductor is facilitated.

4. The module of claim 2, wherein:
   said second ribbon conductor is attached at an angle to the substrate and parallel to the plane of said first ribbon conductor.

5. The module of claim 2 wherein:
   said raised lip is raised at least 0.005 inches from the main body of the carrier.

6. The module of claim 2 wherein:
   the carrier is conductively plated, whereby electrically conductive attachment of said first RF conductor is facilitated.

7. A connection system between microwave circuit modules, comprising:
   a first raised lip of a first metal carrier at an edge of said first carrier;
   a second raised lip of a second metal carrier at an edge of said second carrier;
   a first ribbon conductor having (1) a first edge attached to the first raised lip, and (2) a second edge attached to the second raised lip, such that the distance between the first and second raised lips is bridged;
   a second ribbon conductor having (1) a first end and a second end, said first end attached to a first RF conductor on a first substrate over said first metal carrier, and (2) said second end attached to a second RF conductor on a second substrate over said second metal carrier, the second ribbon conductor having a combination of width and height spanning over the first ribbon conductor such that a constant impedance is maintained.

8. The system of claim 7, wherein:
   said constant impedance is substantially fifty ohms.

9. The system of claim 7, wherein:
   the first and second ribbon conductors are attached by a conductive attachment means.

10. The system of claim 7, wherein:
    the second ribbon conductor spans the distance over the first ribbon conductor at approximately a 45° angle to the first ribbon conductor.

11. The system of claim 10, wherein:

the second ribbon conductor is approximately 0.020 inches wide.

12. The system of claim 7, wherein:
the second ribbon conductor is gold ribbon, approximately 0.001 inches thick by 0.020 inches wide.

13. The system of claim 7, wherein:
the second ribbon conductor comprises a flexing means to absorb the stresses of thermal expansion and compression between its points of attachment.

14. The system of claim 13, wherein:
the flexing means comprises bends formed in at least one place across the width of the second ribbon conductor.

* * * * *